US010302729B2

(12) United States Patent
Stemmer

(10) Patent No.: US 10,302,729 B2
(45) Date of Patent: May 28, 2019

(54) METHOD AND MAGNETIC RESONANCE APPARATUS FOR SPEED-COMPENSATED DIFFUSION-BASED DIFFUSION IMAGING

(71) Applicant: Siemens Aktiengesellschaft, Munich (DE)

(72) Inventor: Alto Stemmer, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 260 days.

(21) Appl. No.: 15/085,161

(22) Filed: Mar. 30, 2016

(65) Prior Publication Data

US 2016/0291113 A1 Oct. 6, 2016

(30) Foreign Application Priority Data

Mar. 30, 2015 (DE) .................. 10 2015 205 693

(51) Int. Cl.
*G01R 33/565* (2006.01)
*G01R 33/561* (2006.01)
*G01R 33/563* (2006.01)

(52) U.S. Cl.
CPC ... *G01R 33/56509* (2013.01); *G01R 33/5616* (2013.01); *G01R 33/5617* (2013.01); *G01R 33/56341* (2013.01)

(58) Field of Classification Search
CPC ............ G01R 33/5608; G01R 33/4835; G01R 33/543; G01R 33/5611; G01R 33/4828; A61B 5/055

(Continued)

(56) References Cited

U.S. PATENT DOCUMENTS 5,539,310 A * 7/1996 Basser ............ G01R 33/56341
324/307
7,804,299 B2 * 9/2010 Reeder ............ G01R 33/56341
324/309

(Continued)

FOREIGN PATENT DOCUMENTS

JP 2002000579 A 1/2002
WO WO-2013025487 A1 2/2013

OTHER PUBLICATIONS

Aliotta et al., "Convex Optimized Diffusion Encoding (CODE) Gradient Waveforms for Minimum Echo Time and Bulk Motion-Compensated Diffusion-Weighted MRI," Magnetic Resonance in Medicine, pp. 00-00 (2016).

(Continued)

*Primary Examiner* — Christopher P McAndrew
(74) *Attorney, Agent, or Firm* — Schiff Hardin LLP

(57) ABSTRACT

In a magnetic resonance imaging system and operating method for generating magnetic resonance image data of an object under examination, in order to acquire magnetic resonance raw data, an operating sequence is determined that has an excitation wherein an RF excitation pulse is radiated, and a readout procedure for receiving RF signals. In addition, a diffusion contrast gradient pulse sequence is generated that includes an uneven number of 2n+1 diffusion contrast gradient pulses switched in chronological succession, with the sum of the zeroth gradient moments of the diffusion contrast gradient pulses having the value zero and the sum of the first gradient moments of the diffusion contrast gradient pulses having the value zero. An RF refocusing pulse is switched between two of the diffusion contrast gradient pulses.

16 Claims, 7 Drawing Sheets

(58) Field of Classification Search
USPC .......................................................... 324/309
See application file for complete search history.

(56) References Cited

U.S. PATENT DOCUMENTS

| | | | |
|---|---|---|---|
| 8,461,840 B2* | 6/2013 | Stemmer | G01R 33/5611 |
| | | | 324/307 |
| 8,570,034 B2* | 10/2013 | Stemmer | G01R 33/246 |
| | | | 324/307 |
| 2004/0140803 A1 | 7/2004 | Deimling | |
| 2008/0025329 A1 | 1/2008 | Livet et al. | |
| 2008/0275329 A1* | 11/2008 | Reeder | G01R 33/56341 |
| | | | 600/410 |
| 2010/0090694 A1* | 4/2010 | Heid | A61B 5/055 |
| | | | 324/309 |
| 2010/0237865 A1 | 9/2010 | Stemmer | |
| 2011/0112393 A1 | 5/2011 | Taniguchi et al. | |
| 2011/0241672 A1* | 10/2011 | King | G01R 33/5612 |
| | | | 324/309 |
| 2013/0335080 A1 | 12/2013 | Jo et al. | |
| 2014/0091797 A1* | 4/2014 | Feiweier | G01R 33/56341 |
| | | | 324/309 |
| 2014/0210471 A1 | 7/2014 | Stemmer | |

OTHER PUBLICATIONS

Thomsen, et al.: "In vivo measurement of water self diffusion by magnetic resonance imaging", Proceedings of the Seventh Scientific Meeting, Society of Magnetic Resonance in Medicine, San Francisco, CA, 1988, p. 890 (1988).

Ozaki, et al.: "Motion Artifact Reduction of Diffusion-Weighted MRI of the Liver: Use of Velocity-Compensated Diffusion Gradients Combined With Tetrahedral Gradients", Journal of Magnetic Resonance Imaging, vol. 37, pp. 172-178, (2013).

Storey, et al., "Partial k-Space Reconstruction in Single-Shot Diffusion-Weighted Echo-Planar Imaging", Magnetic Resonance in Medicine, vol. 57, pp. 614-619 (2007).

Majewski et al.: "MRI Pulse Sequence Design with First-Order Gradient Moment Nulling in Arbitrary Directions by Solving a Polynomial Program"; IEEE Transactions on Medical Imaging; vol. 29; No. 6; pp. 1252-1259; (2010).

Keller et al: "Gradient Moment Nulling Through the Nth Moment. Application of Binominal Expansion Coefficients to Gradient Amplitudes"; Journal of Magnetic Resonance vol. 78; pp. 145-149; (1988).

Pipe. et al: "A Progressive Gradient Moment Nulling Design Technique"; Magnetic Resonance in Medicine; vol. 19; pp. 175-179; (1991).

* cited by examiner

METHOD AND MAGNETIC RESONANCE APPARATUS FOR SPEED-COMPENSATED DIFFUSION-BASED DIFFUSION IMAGING

BACKGROUND OF THE INVENTION

Field of the Invention

The invention concerns a method for operating a magnetic resonance imaging system for generating magnetic resonance image data of an object under examination, with which magnetic resonance raw data are acquired. The invention also concerns an actuation sequence for actuating a magnetic resonance imaging system. In addition, the invention concerns a magnetic resonance imaging system designed to implement such a method.

Description of the Prior Art

For the generation of magnetic resonance recordings, the body to be examined is exposed to a relatively high basic magnetic field of for example, 1.5 tesla, 3 tesla, or in newer high magnetic field systems, even 7 tesla and more. Then a suitable antenna device emits a radio-frequency excitation causing the nuclear spins of specific atoms that are excited to resonance by this radio-frequency field in the magnetic field to be flipped by a specific flip angle relative to the magnetic field lines of the basic magnetic field. The radio-frequency signal radiated by the nuclear spins as they relax, called the magnetic resonance signal, is then detected with suitable antenna devices, which can be the same as the transmission antenna device. Following demodulation and digitization, the raw data acquired in such a manner are used in order to reconstruct the desired image data. For spatial encoding of the magnetic resonance signals, respective defined magnetic field gradients are superimposed on the basic magnetic field during the transmission and readout or reception of the radio-frequency signals.

A magnetic resonance recording is typically composed of a number of individual partial measurements in which raw data from different slices of the object under examination are recorded in order subsequently to reconstruct volume image therefrom.

However, in many examinations it is also necessary to perform multiple—i.e. a whole series—of magnetic resonance recordings of the object under examination, wherein a specific measurement parameter is varied. The measurements are used to observe the effect of this measurement parameter on the object under examination in order to draw diagnostic conclusions therefrom later. Here, a series should be understood to mean at least two, but generally more than two, magnetic resonance recordings. Advantageously, in this case, a measurement parameter is varied such that the contrast of a specific type of material excited during the measurements, for example a tissue type of the object under examination or a chemical substance, which is significant for the majority of, or specific, tissue types, such as, for example, water, is affected as greatly as possible by the variation of the measurement parameter. This ensures that the effect of the measurement parameter on the object under examination is particularly clearly visible.

Typical examples of series of magnetic resonance recordings with the variation of a measurement parameter strongly affecting the contrast are diffusion imaging methods (or diffusion weighted imaging (DWI)). Diffusion should be understood to mean the Brownian motion of molecules in a medium. In diffusion imaging, as a rule, multiple images with different diffusion directions and weightings are recorded and combined with one another. The strength of the diffusion weighting is generally defined by the so-called "b-value". The diffusion images with different diffusion directions and weightings or the combined images derived therefrom can then be used for diagnostic purposes. For example, suitable combinations of the diffusion-weighted images recorded can be used to generate parameter maps providing special diagnostic information, such as, for example, maps reflecting the "apparent diffusion coefficient (ADC)" or "fractional anisotropy (FA)".

Diffusion imaging is frequently based on echo planar imaging (EPI) due to the short acquisition time of the EPI sequence for each image and its robustness with respect to motion. With diffusion imaging with EPI, even when there is no motion of the patient, which can also play a part, the diffusion-weighted images contain distortion due to local $B_0$ inhomogeneities and residual eddy current fields. The latter are determined by the direction and strength of the diffusion weighting. Such distortion can result in errors in the evaluated diffusion maps.

In the case of diffusion-weighted imaging, additional gradients are inserted into a pulse sequence in order to visualize or measure the diffusion properties of the tissue. These gradients have the result that tissue with rapid diffusion (for example cerebrospinal fluid, CSF) is subject to a greater signal loss than tissue with slow diffusion (for example the grey matter in the brain). The resulting diffusion contrast is becoming increasingly clinically significant and applications now extend way beyond the conventional early identification of ischemic stroke.

A typical pulse sequence for diffusion imaging is the Stejskal-Tanner diffusion sequence, as depicted in FIG. 1. However, when this kind of pulse sequence is used for diffusion-weighted imaging of the liver and heart, signal losses occur which are attributable to the motion of the heart. These signal losses increase with the diffusion weighting and hence result in an overestimation of the apparent diffusion coefficient (ADC). This is a problem when the ADC value is used as a discriminator between benign and malignant lesions.

One possibility for significantly reducing artifacts due to the motion of the heart (and other macroscopic movements), consists in replacing the standard-Stejskal-Tanner diffusion sequence with unipolar gradients by a sequence with velocity-compensated bipolar gradients, as shown in FIG. 2. The main disadvantage of this velocity-compensated sequence is that the bipolar gradients in this sequence have significantly less diffusion sensitivity than the Stejskal-Tanner sequence. Therefore, to achieve the desired diffusion sensitivity, the gradient duration must be extended by at least a factor of 1.6. This results in a prolongation of the echo time of the sequence and hence, due to the inherent T2 decay of the tissue, to a deterioration of the signal/noise ratio (SNR), which can only be compensated by a significantly longer measuring time.

A description of the velocity-compensated diffusion sequence in the prior art and its insensitivity to macroscopic motion can be found in a conference paper given by C. Thomsen, P. Ring and O. Henriksen with the title "In vivo measurement of water self-diffusion by magnetic resonance imaging", published in "Proceedings of the Seventh Scientific Meeting, Society of Magnetic Resonance in Medicine," page 890, San Francisco, Calif. (1988).

This sequence was later used in numerous publications in order to reduce artifacts caused by macroscopic motion. A current publication in which the sequence is used in diffusion-weighted imaging of the liver in order to reduce artifacts caused by heart motion, is an article by Masanori Ozaki et al.: "Motion Artifact Reduction of diffusion-Weighted MRI of the Liver: Use of Velocity-Compensated diffusion Gradients Combined With Tetrahedral Gradients", which appeared the JOURNAL OF MAGNETIC RESONANCE IMAGING, Volume 37, pages 172-178 (2013), DOI 10.1002/jmri.23796. The authors also discuss the aforementioned problem that, compared to a Stejskal-Tanner sequence, for a desired b-value, this sequence requires gradient switching extended by a factor of 1.6 and hence, as a result of the extended echo time, the SNR of the images is reduced. The authors address this by using a direction-independent diffusion preparation with which gradients are switched on all three axes simultaneously. Hence, this achieves reduced TE (and hence improved SNR) compared to a direction-independent preparation sequence with which gradients are only switched on one axis.

Here, reference is made to the fact that stimulated echo preparation (STEAM—from "stimulated echo acquisition mode"), which can achieve a desired diffusion-sensitization with a particularly short echo time, is not velocity-compensated and is hence sensitive to macroscopic motion. Reference is further made to the fact that times of different lengths for diffusion sensitization before and after the RF refocusing pulse are not the exception, but the rule. Symmetrization of the two times (for example due to the non-acquisition of the earlier lines of an EPI readout train) can entail significant problems up to complete signal loss if the echo is shifted in the k-space due to macroscopic motion during diffusion sensitization in the non-acquired range.

SUMMARY OF THE INVENTION

An object of the present invention is to operate a magnetic resonance imaging system for generating magnetic resonance image data of an object under examination with a velocity-compensated diffusion sequence with which a higher diffusion sensitivity can be achieved in a defined time, compared to conventional velocity-compensated sequences, or alternatively a desired diffusion sensitivity can be achieved in a shorter time.

In the method according to the invention for operating a magnetic resonance imaging system for generating magnetic resonance image data of an object under examination, magnetic resonance raw data are acquired by executing at least one diffusion contrast pulse sequence. Furthermore, the sequence according to the invention includes at least one excitation procedure with which an RF excitation pulse is generated. In addition, the sequence according to the invention has a readout procedure for the acquisition of magnetic resonance raw data with which RF signals are acquired. The method according to the invention additionally includes a step for diffusion sensitization using a diffusion contrast gradient pulse sequence with an uneven number $2n+1$ of diffusion contrast gradient pulses, where n is a natural number. In this case, the uneven number $2n+1$ of diffusion contrast gradient pulses is generated in a chronological sequence such that the sum of the zeroth gradient moments of the diffusion contrast gradient pulses has the value zero and the sum of the first gradient moments of the diffusion contrast gradient pulses has the value zero. In addition, an RF refocusing pulse is radiated between two of the diffusion contrast gradient pulses.

The n-th moment $m_n(t)$ of a gradient arrangement $G_i$ should be understood to mean the integral $$m_n(t) = \int_0^t G_i(\tau) \cdot \tau^n d\tau. \tag{1}$$

Hence, the phase of a small sample located at the site $r_0$ at the time 0 (midpoint of the excitation pulse) and moving at a constant velocity $v_0$ through the measuring volume is obtained as:

$$\phi(t) = \tag{2}$$
$$2\pi\gamma \int_0^t \vec{G}(\tau)\vec{r}(\tau)d\tau = 2\pi\gamma \int_0^t \vec{G}(\tau)[\vec{r}_0 + \vec{v}_0(\tau)]d\tau = 2\pi\gamma[\vec{m}_0\vec{r}_0 + \vec{m}_1\vec{v}_0]$$

Therefore, moved spins acquire an additional phase $\varphi$ proportional to their velocity $v_0$ and to the first moment of the gradient arrangement G. If the velocity of the different spins contributing to the signal of a voxel or image point (an image point can be a pixel or voxel) differs, this additional phase $\varphi$ can result in a dephasing of the signal and hence to extinctions in the calculated images.

Due to the fact that, with the method according to the invention, the first and the second gradient moments $m_1(t)$ $m_2(t)$ of the diffusion contrast gradient pulse sequence each has the value zero, the above-described dephasing of the signal is avoided.

Diffusion contrast gradients should be understood to mean the afore-mentioned gradients inserted in a pulse sequence additionally to the gradients switched for the image generation, which are used to visualize or measure the diffusion properties of the tissue. Hereinafter, these diffusion contrast gradients will often be referred to in short as "gradients" or also "diffusion gradients".

The choice of a uneven number of diffusion contrast gradient pulses has the result that the sum of the zeroth gradient moments of at least a part of adjacent gradient pulses in the period between the RF excitation pulse and the RF refocusing pulse and/or in the period between the time of the RF refocusing pulse and the time of the start of the readout process does not the produce the value zero. This fact is used in order to use periods between said adjacent gradient pulses for diffusion sensitization and thus, in addition to velocity compensation, also to achieve improved diffusion sensitization.

The object of diffusion weighting is to attenuate the signal from tissue with fast diffusion (for example free water) more strongly than tissue with slow diffusion. As mentioned in the introduction, diffusion in lesions is frequently restricted. In the reconstructed images, these areas with restricted diffusion then appear light-colored. In general, the restriction of the diffusion in the tissue is dependent on the direction. Mathematically, the direction dependency of the diffusion restriction of the tissue is described as a tensor, the symmetrical diffusion tensor D:

$$D = \begin{bmatrix} D_{xx} & D_{xy} & D_{xz} \\ D_{xy} & D_{yy} & D_{yz} \\ D_{xz} & D_{yz} & D_{zz} \end{bmatrix}. \tag{3}$$

The sensitivity of the MR measuring method with respect to diffusion is also direction-dependent due to the direction of the diffusion gradients and is described by a further tensor b:

$$b = \begin{bmatrix} b_{xx} & b_{xy} & b_{xz} \\ b_{xy} & b_{yy} & b_{yz} \\ b_{xz} & b_{yz} & b_{zz} \end{bmatrix}. \quad (4)$$

Here, the components of the symmetrical b-tensor are determined by the k-space trajectory of the sequence by $$b_{ij}(TE) = \int_0^{TE} k_i(\tau)k_j(\tau)d\tau \quad (5)$$

with $$k_i(t) = 2\pi \int_0^t G_i(\tau)d\tau. \quad (6)$$

Here, $G_i(t)$ is the amplitude of the gradients switched in the direction i at the time t and $\gamma$ the gyromagnetic ratio, which for protons is 42.576 MHz/T. The integration range extends from the middle of the RF excitation pulse in a pulse sequence until the echo time TE. In fact, all switched gradients contribute to the diffusion sensitivity of the MR sequence. The calculation frequently only includes the gradients explicitly switched for the diffusion weighting, i.e. the diffusion contrast gradients, since these as a rule have higher amplitudes and a longer duration than the gradients switched for the image generation and therefore dominate the diffusion sensitivity.

Hence, the attenuation of an MR signal can be written as follows:

$$S = S_0 e^{-bD}. \quad (7)$$

Here, $S_0$ is the signal without diffusion and bD the tensor product from the diffusion tensor D of the tissue and b-tensor of the sequence:

$$bD = \sum_{i=[x,y,z]} \sum_{j=[x,y,z]} b_{ij} D_{ij} \quad (8)$$

The diffusion gradients are frequently switched along one single axis or three measurements are performed one after the other with which the diffusion gradients are each switched along three directions that are orthogonal to one another. In this case, if the diffusion gradients are switched in the coordinate system in which the diffusion tensor is also defined, formula (7) produces:

$$S_x = S_0 e^{-b_{xx} D_{xx}}$$

$$S_y = S_0 e^{-b_{yy} D_{yy}}$$

$$S_z = S_0 e^{-b_{zz} D_{zz}} \quad (9)$$

Therefore, in each case only a single element of the b-tensor contributes to the MR signal. In this context, this element is also called the b-value $b = b_{xx} = b_{yy} = b_{zz}$ of the diffusion sequence. This b-value (and the other elements of the diffusion tensor) can be calculated using formulas (7) and (8).

It can be identified from formulas (5) and (6) that a time segment of the pulse sequence in which no gradient is switched can only contribute to diffusion sensitivity when the zero moment of the gradient pulse sequence does not have the value zero up to the start of the respective time segment.

The invention makes use of the observation that, in diffusion imaging based on the spin-echo technique, frequently more time is available for diffusion preparation before the RF refocusing pulse than after the RF refocusing pulse. The reasons for this depend upon the readout module used. By far the most important readout module used in clinical imaging is a single shot echo planar readout train (abbreviation EPI, derived from "echoplanar imaging") with which a complete image is readout about each spin echo. Here, the echo train is as a rule started such that the acquisition of the k-space center line coincides with the spin echo. Due to the unavoidable T2* decay during the echo train, the k-space can only be linearly encoded in the EPI technique, i.e., with a symmetrical readout of the k-space, the center of the k-space is readout in the center of the echo train. The duration of an echo train is approximately 64 ms (128 acquired lines, effective echo spacing 0.5 ms). I.e., the half echo time TE/2 between the RF refocusing pulse and the spin echo requires the readout time $TA_1 \sim 32$ ms to read out the early echo (see FIG. 1) and is hence not available for diffusion preparation. However, during the equally long half echo time TE/2 between the RF excitation pulse and the RF refocusing pulse, only the time during which the RF pulses are played out is not available for diffusion preparation. However, the duration of RF pulse is as a rule only a few milliseconds, i.e. it is short compared to the duration of the EPI readout train. Although, theoretically, asymmetrical acquisition of the k-space would be possible with which fewer k-space lines would be acquired before the k-space center line than after the k-space center line and hence the time $TA_1$ in FIG. 1 is shortened, this can result in complete signal loss since the actual echo is frequently shifted in the k-space as a result of macroscopic motion during the diffusion preparation.

The unequal times before and after the RF refocusing pulse are achieved according to the invention by the choice of a uneven number of diffusion contrast gradient pulses since, with a constellation of this kind in combination with the further features according to the invention, namely that the global zeroth gradient moment and the global first gradient moment have the value zero, the temporal midpoint of the diffusion contrast gradient pulse sequence does not coincide with the time of the RF-refocusing pulse. The choice of an uneven number of diffusion contrast gradient pulses and said features also means that the sum of the zeroth gradient moments of the gradient pulses in the period between the RF excitation pulse and the start of the RF refocusing pulse and/or in the period between the time of the end of the RF refocusing pulse and the time of the start of the readout process does not Produce the value zero. In this way, time intervals during which no diffusion gradient pulses can be switched, such as, for example, during the RF refocusing pulse, can also contribute to the diffusion sensitization, i.e. the b-value.

Due to the higher diffusion sensitization, the method according to the invention achieves a further reduction in the echo time. In addition, the method according to the invention enables switching of gradients on all three axes simultaneously in order to minimize the echo time. This additional measure can supplement or be combined with the method according to the invention when attempting to reduce the echo time.

The actuation sequence according to the invention for actuating a magnetic resonance imaging system includes an RF excitation pulse, a readout module and a diffusion contrast gradient pulse sequence with an RF refocusing pulse. The diffusion contrast gradient pulse sequence has an uneven number of diffusion contrast gradient pulses. The diffusion contrast gradient pulses are dimensioned and positioned such that the sum of the zeroth gradient moments of the diffusion contrast gradient pulses has the value zero and the sum of the first gradient moments of the diffusion contrast gradient pulses has the value zero. In this context, a readout module should be understood to mean a part sequence, which includes gradient pulses inter alia for the frequency encoding and phase encoding of the signals received and one or more time windows in which a measuring signal in the form of an echo signal can be acquired. Moreover, the readout module can contain further RF pulses and/or gradient pulses for the repeated formation of a plurality of echo signals and the encoding thereof.

With the diffusion contrast gradient pulse sequence according to the invention, as with the conventional velocity-compensated sequence, the artifacts caused by a macroscopic motion such as heart motion are reduced. However, the minimum echo time required in order to achieve the desired diffusion sensitivity is as a rule significantly shorter with the diffusion contrast gradient pulse sequence according to the invention. Hence, the signal/noise ratio of the reconstructed images is higher and hence the measuring time prolongation lower compared to a Stjeskal-Tanner sequence (see FIG. 1) than is the case with the conventional velocity-compensated pulse sequence shown in FIG. 2. The lower measuring time prolongation is also the result of the fact that, due to the improved signal/noise ratio, it not necessary to repeat measurements for averaging as frequently.

The pulse sequence according to the invention is velocity-compensated and is hence, like the velocity-compensated sequence in the prior art, less sensitive to macroscopic motion than the non-velocity-compensated Stejskal-Tanner sequence. As a result, in abdominal diffusion-weighted imaging, this in particular avoids artifacts due to heart motion, which are repeatedly reported in the case of measurements with the Stejskal-Tanner sequence (see FIG. 1). In particular, with the actuation sequence according to the invention, the minimum echo time required in order to achieve a desired diffusion sensitivity is always shorter than with a conventional velocity-compensated sequence as shown in FIG. 2 when time intervals of different lengths are available for the diffusion sensitization before and after the RF refocusing pulse. In this case, with the actuation sequence according to the invention, it is possible to achieve a desired diffusion sensitivity with a shorter echo time than is possible with the conventional velocity-compensated sequence shown in FIG. 2. As already mentioned, the result of the shorter echo time is that the signal/noise ratio of the reconstructed images is higher and hence the measuring time prolongation compared to a Stejskal-Tanner sequence (see FIG. 1) is lower. In the case of tissues with a short transversal relaxation time (for example the liver parenchyma, T2~40 ms at 1.5 T), the T2 decay also restricts the maximum echo time at which imaging is still advisable. With a predefined echo time, the maximum diffusion-sensitization that can be achieved in the specified time is higher under the specified conditions with the sequence according to the invention than with the velocity-compensated sequence (shown in FIG. 2) in the prior art.

The actuation sequence determination system according to the invention is embodied to determine the actuation sequence according to the invention which can be executed by the scanner of a magnetic resonance imaging system. For example, the actuation sequence determination system determines a suitable pulse sequence or actuation sequence on the basis of parameter data originating, for example, from a measurement protocol.

The magnetic resonance imaging system according to the invention includes a control computer, which is configured to control the scanner of the magnetic resonance imaging system by executing the method according to the invention. The magnetic resonance imaging system according to the invention includes the actuation sequence determination system according to the invention.

The basic components of the actuation sequence determination device according to the invention and the control computer according to the invention can for the most part be embodied in the form of software components. In principle, however, these components can also be partly, particularly for fast calculations, implemented in the form of software-supported hardware, for example FPGAs or the like. Similarly, the interfaces required between individual functional components, for example when only a transfer of data from other software components is involved, can be embodied as software interfaces. However, it can also be embodied as hardware-based interfaces actuated by suitable software.

A substantially software-based implementation has the advantage that the control devices or actuation sequence determination devices used to date can also be easily retrofitted by a software update in order to work in accordance with the invention. The aforementioned object also is achieved in accordance with the invention by a non-transitory, computer-readable data storage medium that can be loaded directly into a memory of a control computer of a magnetic resonance imaging system. The storage medium is encoded with program code that causes all the steps of the method according to the invention to be implemented when the program code is executed in the control computer. The storage medium can optionally include additional components such as, for example, documentation and/or other components, including hardware components, such as, for example, hardware keys (dongles etc.) for using the software.

The computer-readable storage medium can be, for example, a memory stick, a hard disk or another transportable or a permanently integrated data carrier on which the program code is stored. The computer can be one or more interacting microprocessors or the like.

In the context of the invention, it is possible for different features of different exemplary embodiments to be combined to form further exemplary embodiments.

In an embodiment of the method according to the invention, from the uneven number, i.e. 2n+1 diffusion contrast gradient pulses, the first to n-th diffusion contrast gradient pulses to the n+2-th to 2n+1-th diffusion contrast gradient pulses are each arranged in point-symmetric pairs with respect to the temporal midpoints of the diffusion contrast gradient pulse sequence and the n+1-th diffusion contrast gradient pulse is axially symmetrical to an axis of symmetry extending in the ordinate direction through the temporal midpoint of the diffusion contrast gradient pulse sequence and has a zeroth gradient moment of twice the magnitude of the sum of the zeroth gradient moments of the 1-th to n-th gradient pulses. This specific arrangement and dimensioning of the diffusion contrast gradient pulses ensures that the sum of the first and second gradient moments of the diffusion contrast gradient pulses has the value zero and hence a velocity-compensated pulse sequence is achieved. It is furthermore ensured that the sum of the diffusion contrast gradient pulses temporally preceding the diffusion contrast gradient pulse positioned on the axis of symmetry of the diffusion contrast gradient pulse sequence is not zero so that at least a part of the times between the diffusion contrast gradient pulses can be used for the diffusion sensitization since, at these times, the excited spins are dephased and hence the time interval between gradients, during which no gradients are applied, contributes to the b-value.

In a preferred variant of the method according to the invention, the temporal midpoint of the diffusion contrast gradient pulse sequence occurs chronologically before the time of the RF refocusing pulse. As already mentioned, with the method according to the invention, the minimum echo time required to achieve a desired diffusion sensitivity is always shorter than with a conventional velocity-compensated sequence, as shown in FIG. 2 when time intervals of different lengths are available for the diffusion sensitization before and after the RF refocusing pulse. In the preferred variant of the method according to the invention, this is achieved by shifting the temporal midpoints of the diffusion contrast gradient pulse sequence before the time of the RF refocusing pulse. In this case, as a rule, the time intervals for the diffusion sensitization are longer before the RF refocusing pulse than after the RF refocusing pulse.

With the method according to the invention, it is particularly advantageous for the sum of the zeroth gradient moments of two directly sequential diffusion contrast gradient pulses to have a value different from zero. As already mentioned, this feature is a condition for time intervals without gradient switching that directly follow the two chronologically adjacent diffusion contrast gradient pulses contributing to the diffusion sensitization.

In a particularly effective variant of the method according to the invention, the RF refocusing pulse is switched between the n+1-th and the n+2-th diffusion contrast gradient pulse. In this case, the n+1-th diffusion contrast gradient pulse preferably has the same positive or negative sign as the n-th diffusion contrast gradient pulse.

In one alternative embodiment of the method according to the invention, the RF refocusing pulse is switched between the n-th and the n+1-th diffusion contrast gradient pulse and the n+1-th diffusion contrast gradient pulse has the opposite positive or negative sign to that of the n-th diffusion contrast gradient pulse.

In a very practicable variant of the method according to the invention, all diffusion contrast gradient pulses have an amplitude of the same magnitude and the duration of the individual diffusion contrast gradient pulses is selected such that all the time available for the diffusion sensitization is utilized. In this case, an optimum result is achieved relating to the minimization of the required echo time of the pulse sequence used. Utilization of the time available for the diffusion sensitization should be understood to mean that, with the exception of the time intervals in which the RF excitation pulse and the readout modules are switched, the echo time is used for the diffusion sensitization.

Preferably, the readout module comprises an EPI echo train. With EPI echo trains, all k-space lines can be read out after an RF excitation.

In a particularly effective and simple-to-implement embodiment of the method according to the invention, n=2, so that 5 gradient pulses are switched. This number of gradient pulses enables the echo time to be kept particularly short. This is because, with the smallest possible number of gradient pulses, the sum of the ramp times for ramping up gradients is particularly short.

In a particularly preferred variant of the method according to the invention, in particular, when n=2, the positive or negative sign before the first and second diffusion contrast gradient pulses are different.

In an alternative embodiment of the method according to the invention, with a number of five diffusions-gradient pulses, the temporal duration of the second and of the fourth diffusion contrast gradient pulse has the value zero. In this case, the number of the diffusion contrast gradient pulses is actually only three. This special variant is particularly efficient when the time available before the RF refocusing pulse for the diffusion sensitization is much longer than the time available for the diffusion sensitization after the RF refocusing pulse.

In a slice-selective variant of the method according to the invention, in the excitation process, at least one slice selection gradient in slice selection direction is generated in synchronism with the RF excitation pulse. Furthermore, preferably during the readout process, a slice selection gradient is generated in synchronism with the RF refocusing pulse. Slice selection gradients can be used for the selective excitation of selective slices and for the visual representation of the diffusion behavior thereof using the method according to the invention.

DESCRIPTION OF THE PREFERRED EMBODIMENTS

Figure 1:
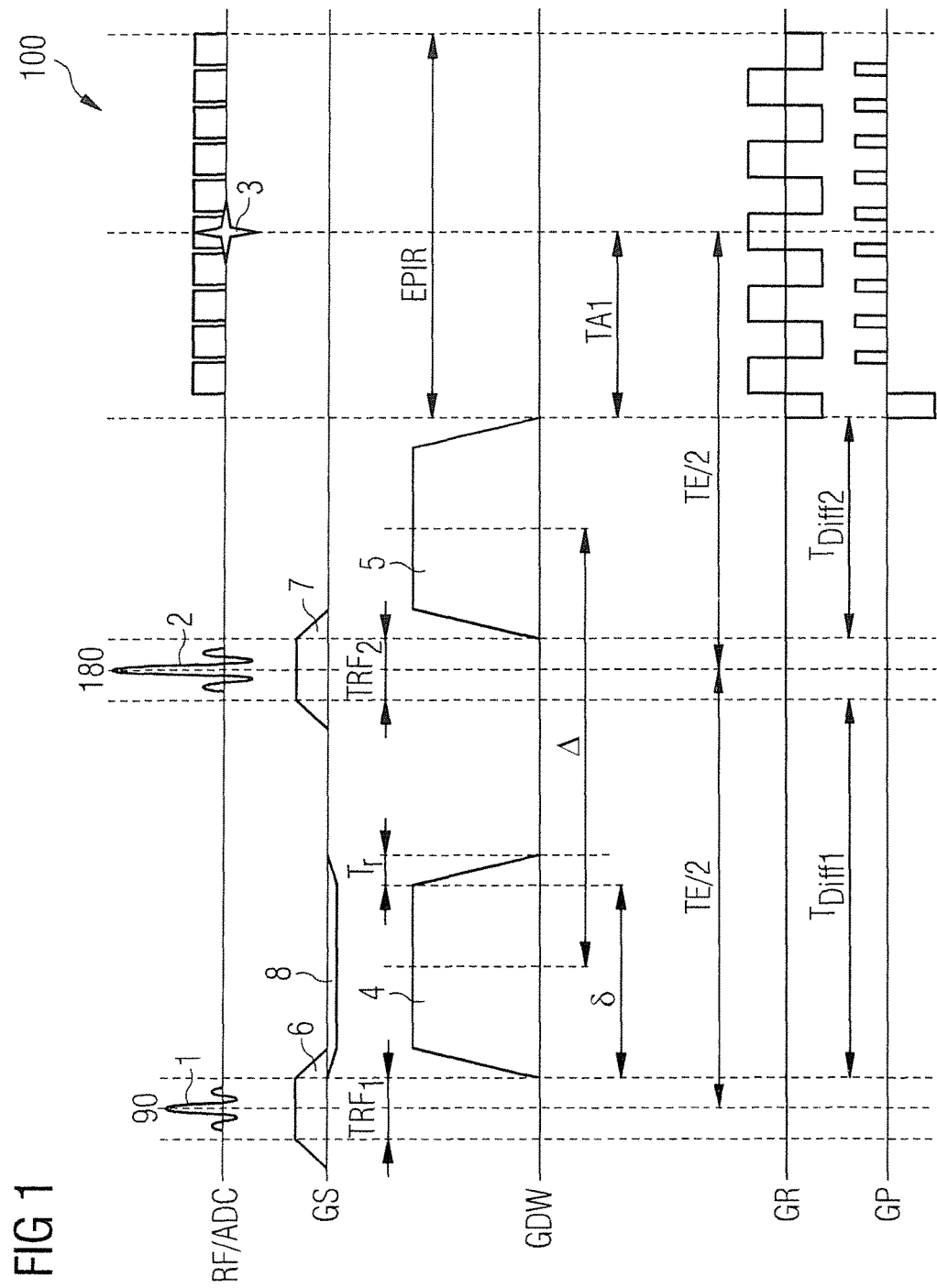
FIG. 1 is a sequence diagram depicting the known Stejskal-Tanner-pulse sequence.

FIG. 1 shows a Stejskal-Tanner sequence. This is by far the most important diffusion-weighted pulse sequence in the prior art. The first line of the graph, which is identified with RD/ADC, shows an RF excitation pulse 1, which is switched as the start of a pulse sequence simultaneously with a slice selection gradient 6 (see second line GS) and an RF refocusing pulse 2, which is switched between two diffusion contrast gradient pulses 4, 5 (see third line GDW) and with which a slice selection gradient 7 is also switched simultaneously (see second line GS). The gradient pulses 4, 5 have the same polarity and as a rule the same amplitude and duration. The RF refocusing pulse 2 forms a spin echo 3 (see first line), which, in the example shown, is read out with an EPI echo readout train EPIR comprising a plurality of readout windows. Furthermore, in the graph in FIG. 1, the second line from the bottom shows a gradient sequence GR in the readout direction (frequency encoding direction) and the lowest line shows a gradient sequence GP in the phase encoding direction.

The echo time TE is the time between the RF excitation pulse and the echo 3. This can be adjusted via the time interval TE/2 between the RF excitation pulse and the RF refocusing pulse, which is half as long as the echo time TE. With the Stejskal-Tanner sequence shown in FIG. 1 with symmetrical trapezoidal diffusion-gradients 4, 5 with the amplitude G, the following is obtained for the b-value:

$$b_{stejskal} = 4\pi^2 \gamma^2 G^2 [\delta^2(\Delta-\delta/3) + T_r^3/30 - \delta RT_r^2/6]. \quad (10)$$

Here, $T_r$ is the ramp time, i.e. the duration of one of the two flanks of the gradients, and $\delta$ the so-called duration of a trapezoidal gradient, which defined as sum of the flat top time and a ramp time of the gradient. Here, the flat top time is the time interval during which the amplitude of the gradient is constant. $\Delta$ is the time that passes between the switching-on of the two gradient pulses 4, 5. The above-defined time intervals are visualized in FIG. 1. Formula (10) only takes account of the contribution of the diffusion contrast gradients 4 and 5 to the b-value of the sequence. Therefore, the strong diffusion contrast gradients 4, 5 in the Stejskal-Tanner sequence not only make the sequence sensitive to undirected molecular Brownian motion, but, undesirably, also extremely sensitive to macroscopic motion, since the signal from moved spins is dephased. This dephasing can be avoided (or significantly reduced) with gradient sequences the first moment of which is zero at a desired time. If, after this time, no further gradients are switched in the direction observed, the first moment according to formula (1) is also zero for all later times. In this context, reference is made to velocity or flow-compensated gradient sequences. Generally, the technique of setting specific moments of a gradient arrangement such that they adopt the value zero is also known "gradient moment nulling".

Figure 2:
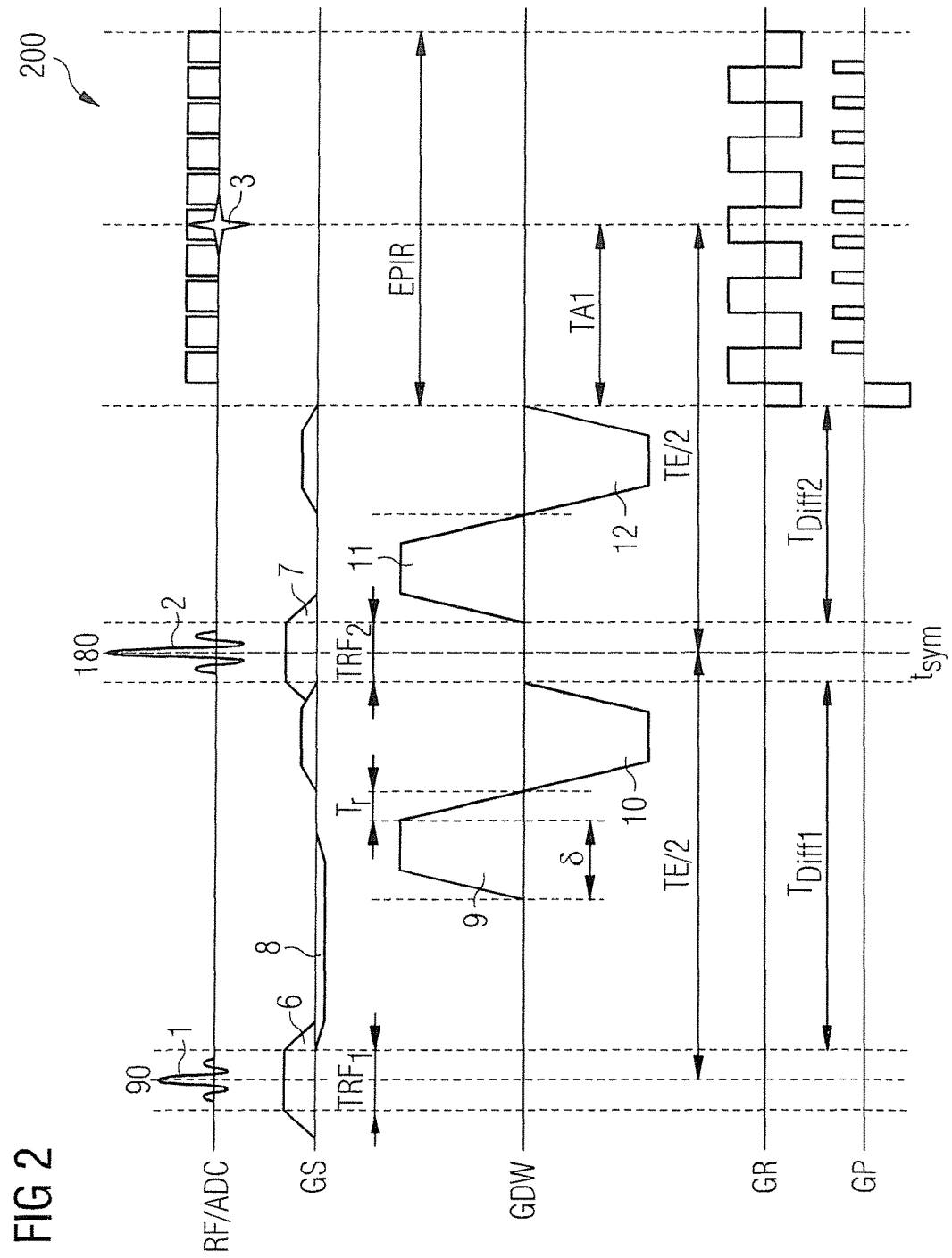
FIG. 2 is a sequence diagram depicting a conventional flow-compensated diffusion contrast pulse sequence.

A diffusion-gradient sequence of this kind the first moment of which is equal to zero, and which is hence insensitive to macroscopic motion, is shown in FIG. 2. FIG. 2 shows a conventional flow-compensated diffusion-contrast sequence. It comprises two respective trapezoidal diffusion contrast gradients 9, 10, 11, 12, which are switched chronologically before and chronologically after the RF refocusing pulse 2. The first gradient moment $m_1$ of the arrangement has the value zero at the end of the fourth gradient 12. When calculating the gradient moment, it should be noted that the RF refocusing pulse 2 negates the phase that was accumulated immediately before its isodelay point (with symmetrical pulses the temporal midpoint of the RF refocusing pulse). Therefore, during the calculation of a gradient moment with the aid of formula (1) for a time t after the RF refocusing pulse 2, the positive or negative sign before gradients 9, 10, which are switched before the RF refocusing pulse 2, should be reversed. Taking account of these rules for the positive or negative sign, the gradient arrangement GDW is symmetrical to its temporal midpoint (which in FIG. 2 coincides with the midpoint of the RF refocusing pulse 2). The following applies to symmetrical gradient arrangements:

$$m_1(t) = m_0(t - t_{sym}). \quad (11)$$

Here, $t_{sym}$ is the time at which the gradient arrangement is symmetrical. The zero moment $m_0$ of the four gradients 9, 10, 11, 12 accumulates to zero. Hence, it is directly derived from formula (11) that the first moment of the arrangement is zero at all times after the end of the last gradient 12. Alternatively, this result can obviously be calculated by direct integration with the aid of formula (1).

For the b-value of the gradient arrangement in FIG. 2, the following is obtained with the aid of formulas (5), (6):

$$b_{vc} = 4\pi^2 \gamma^2 G^2 [(4/3)\delta^3 + 2\delta^2 T_r + T_r^3/15 - \delta T_r^2/3]. \quad (12)$$

The following describes a comparison of the diffusion sensitivity of the two pulse sequence sequences from FIGS. 1 and 2. The echo time TE, the duration of the RF pulses $TRF_1$, $TRF_2$ and the duration $TA_1$ of the time between start of the EPI readout module EPIR and the acquisition of the k-space line with the smallest phase-encoding moment are predefined. In order to arrive at a simply comparable result, it is assumed that the ramp time $T_r$ is negligible, so that $T_r=0$ can be set. Moreover, $T_{Diff2} = TE/2 - TA1 - TRF_2$ is the time available for the diffusion sensitization after the RF refocusing pulse.

For the Stejskal-Tanner sequence from FIG. 1, the ramp time $T_r=0$, $\delta = T_{Diff2}$ from formula (10) produces:

$$b_{Stejskal} = 4\pi^2 \gamma^2 G^2 \delta^2(\Delta-\delta/3) = 4\pi^2 \gamma^2 G^2 T_{Diff}^2(\Delta - T_{Diff2}/3). \quad (13)$$

Since the time interval $\Delta$ of the two diffusion contrast gradients 4, 5 is always greater than the duration of a diffusion contrast gradient ($\Delta > \delta$), the following also applies:

$$b_{Stejskal} = 4\pi^2 \gamma^2 G^2 T_{Diff2}^2 (2T_{Diff2}/3) = (8/3)\pi^2 \gamma^2 G^2 T_{Diff2}^3. \quad (14)$$

For the velocity-compensated sequence from FIG. 2, $T_r=0$, $\delta = T_{Diff2}/2$ produces:

$$b_{vc} = 4\pi^2 \gamma^2 G^2 (4/3)\delta^3 = (16/3)\pi^2 \gamma^2 G^2 \delta^3 = \tfrac{2}{3}\pi^2 \gamma^2 G^2 T_{Diff2}^3. \quad (15)$$

Therefore, the desired insensitivity to macroscopic motion of the sequence from FIG. 2 is associated with a loss of diffusion sensitivity of more than a factor of 4. In practice, frequently, a desired diffusion sensitivity $b_0$ is predefined. For the time required to achieve this diffusion sensitivity for the diffusion sensitization $T_{Diff2,fc}$, a transformation of formulas (14), (15) produces:

$$T_{Diff2,fc} = \sqrt[3]{\frac{3}{2}\frac{1}{\pi^2\gamma^2G^2}} = \sqrt[3]{4\frac{3}{8}\frac{1}{\pi^2\gamma^2G^2}} > \sqrt[3]{4}\,T_{Diff2,Stjeskal} \approx 1,6 T_{Diff2,Stejskal}. \quad (16)$$

Here, $T_{Diff2,Stejskal}$ is the time for the diffusion sensitization after the RF refocusing pulse which is required with the Stejskal-Tanner sequence to achieve the same diffusion sensitivity $b_0$.

Therefore, the time for the diffusion sensitization and hence the echo time relevant for the T2 decay are prolonged by a factor of 1.6. Due to the relatively short T2 relaxation time of the liver parenchyma, this longer echo time with contrast imaging in the region of the liver is associated with a drastic signal loss, which can only be compensated by significantly longer acquisition times.

Figure 3:
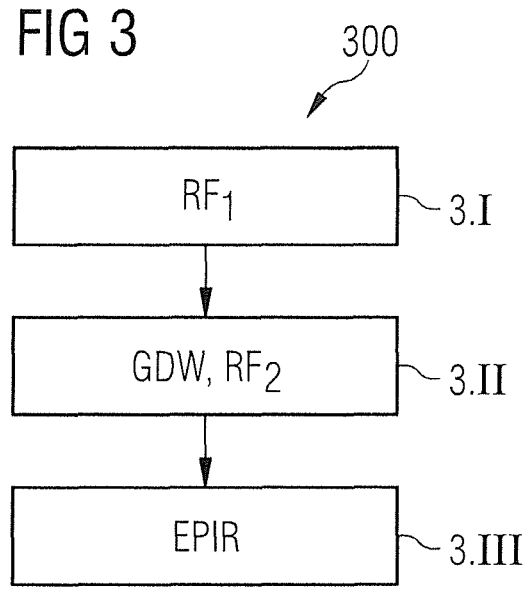
FIG. 3 is a flowchart of an exemplary embodiment of the method according to the invention.

FIG. 3 shows a flow diagram illustrating a method 300 for actuating a magnetic resonance imaging system for generating magnetic resonance image data BD of an object under examination P according to an exemplary embodiment of the invention with which magnetic resonance raw data RD is acquired.

The method includes an excitation procedure, wherein an RF excitation pulse $RF_1$ is generated in Step 3.I. Subsequently, a diffusion contrast gradient pulse sequence GDW is generated in Step 3.II. According to the invention, the diffusion contrast gradient pulse sequence GDW includes an uneven number of 2n+1 diffusion contrast gradient pulses 13, 14, 15, 16, 17 switched in chronological succession, wherein the sum of the zeroth gradient moments $m_0$ of the diffusion contrast gradient pulses 13, 14, 15, 16, 17 has the value zero and the sum of the first gradient moments $m_1$ of the diffusion contrast gradient pulses 13, 14, 15, 16, 17 has the value zero. In addition, the diffusion contrast gradient pulse sequence includes a RF refocusing pulse 2, which is radiated between two of the diffusion contrast gradient pulses. The object of the RF refocusing pulse is that spins for which the signal was dephased, for example due to local off-resonances between the excitation and the RF refocusing pulse, are rephased after the RF refocusing pulse. At an echo time TE lying outside the duration of the GDW the signal is completely rephased.

Furthermore, in Step 3.III, the method 300 has a readout procedure in which magnetic resonance raw data is acquired one or more time windows. The readout interval EPIR includes these time windows. The echo time lies within the readout interval. To be more precise, the readout interval EPIR assigned to the acquisition of magnetic resonance raw data starts at a time TA1 before the echo time TE and extends chronologically by approximately the time $TA_1$ beyond the time of the echo time TE (see FIG. 4).

Figure 4:
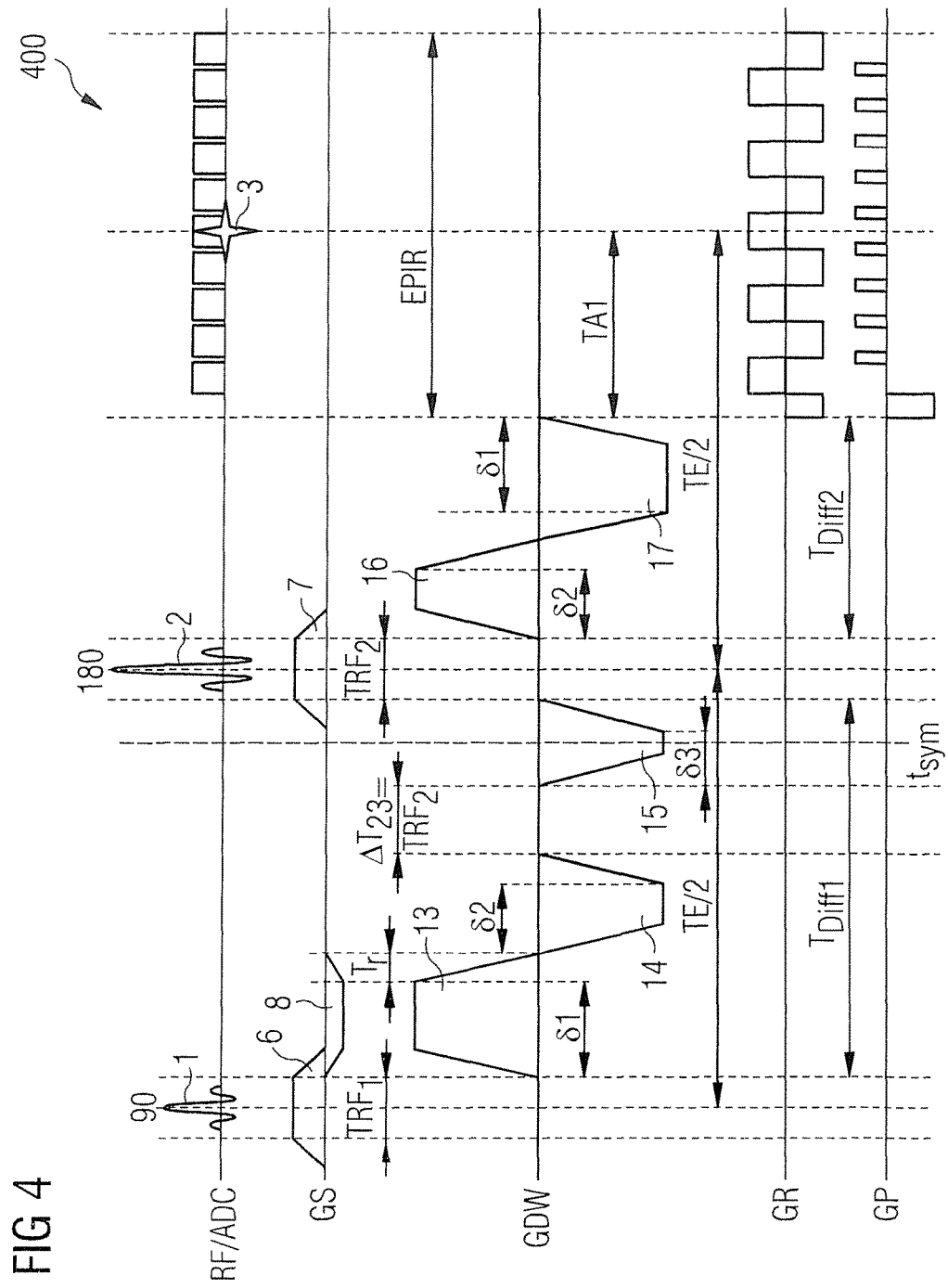
FIG. 4 is a sequence diagram in which a diffusion contrast pulse sequence is illustrated according to a first exemplary embodiment of the invention.

FIG. 4 shows a diffusion contrast pulse sequence 400 according to a first exemplary embodiment of the invention. The diffusion weighting is performed with a sequence GDW of five gradient pulses 13, 14, 15, 16, 17. The time intervals $\Delta T_{23}$ between the end of the second gradient 14 and the start of the third gradient 15 and $TRF_2$ between the end of the third gradient 15 and the start of the fourth gradient 16 are equally long. In the embodiment shown in FIG. 4, an RF refocusing pulse 2 is switched in the second time interval $TRF_2$. The temporal center of the third gradient 15 coincides with the axis of symmetry 18 of the diffusion contrast gradient pulse sequence GDW. The third gradient 15 is mirror-symmetrical with the axis of symmetry 18. The first 13 and fifth gradient 17 and the second 14 and the fourth gradient 16 are each point-symmetrical to the center of symmetry 19 (temporal midpoint of gradient pulse sequence GDW).

Taking into account the rule relating to positive or negative signs for spin echo sequences mentioned in connection with formula (11), the gradient arrangement is also symmetrical. Hence, the value of the first moment $m_1$ is zero for all times after the end of the fifth gradient 17 as long as the zero moment $m_0$ of the gradient pulse sequence GDW disappears. The latter is a necessary condition in order to form an echo 3 at the time TE after the RF excitation pulse 1. The zero moment $m_0$ is then precisely zero when the zero moment of the third gradient 15 is twice the magnitude of the amount of the sum (assigned a positive or negative sign) of the zero moments of the 13 and second 14 or fourth 16 and fifth gradients 17.

Therefore, if symmetrical trapezoidal gradients with the same ramp time $T_r$ and same value for the amplitude G are used, the following applies:

$$\delta_3 = 2(\delta_1 - \delta_2). \tag{17}$$

For the b-value of the gradient pulse sequence GDW in FIG. 4, following the elimination von $\delta_3$, Equations 3, 4, produce the following with the aid of formula (17):

$$b_{vc5} = 4\pi^2\gamma^2 G^2[(4/3)\delta_1^3 + 3\delta_1^2 T_r + \delta_2^2 T_r - 2\delta_1\delta_2 T_r - (1/3)\delta_1 T_r^2 + (1/20)T_r^3 + 2(\delta_1 - \delta_2)^2 T_{RF2}]. \tag{18}$$

In order to obtain a clear comparison with the velocity-compensated sequence in FIG. 2, it is again assumed that the ramp time $T_r = 0$ is negligibly short and two special cases are considered:

In the first special case, it is assumed that the time available for the diffusion sensitization after the RF refocusing pulse 2, $T_{Diff2} = TE/2 - TA1 - T_{RF2}/2$, is equal to the time $T_{Diff1}$ available before the RF refocusing pulse. (In the examples shown: $T_{Diff1} = TE/2 - T_{RF1}/2 - T_{RF2}/2$), i.e. $T_{Diff2} = T_{Diff1}$.

The maximum diffusion-sensitization in the given time is obtained if $\delta_1 = \delta_2$ is inserted and hence according to formula (17): $\delta_3 = 0$.

In this borderline case, the third gradient 15 disappears and the sequence is identical to the sequence in FIG. 2. Accordingly, the insertion of $\delta_1 = \delta_2 = T_{Diff2}/2$ produces $T_r = 0$:

$$b_{vc5}(1) = 4\pi^2\gamma^2 G^2[(4/3)\delta_1^3] = 4\pi^2\gamma^2 G^2[(4/3)(T_{Diff2}/2)^3] = (2/3)\pi^2\gamma^2 G^2 T_{Diff2}^3 = b_{vc}. \tag{19}$$

Figure 5:
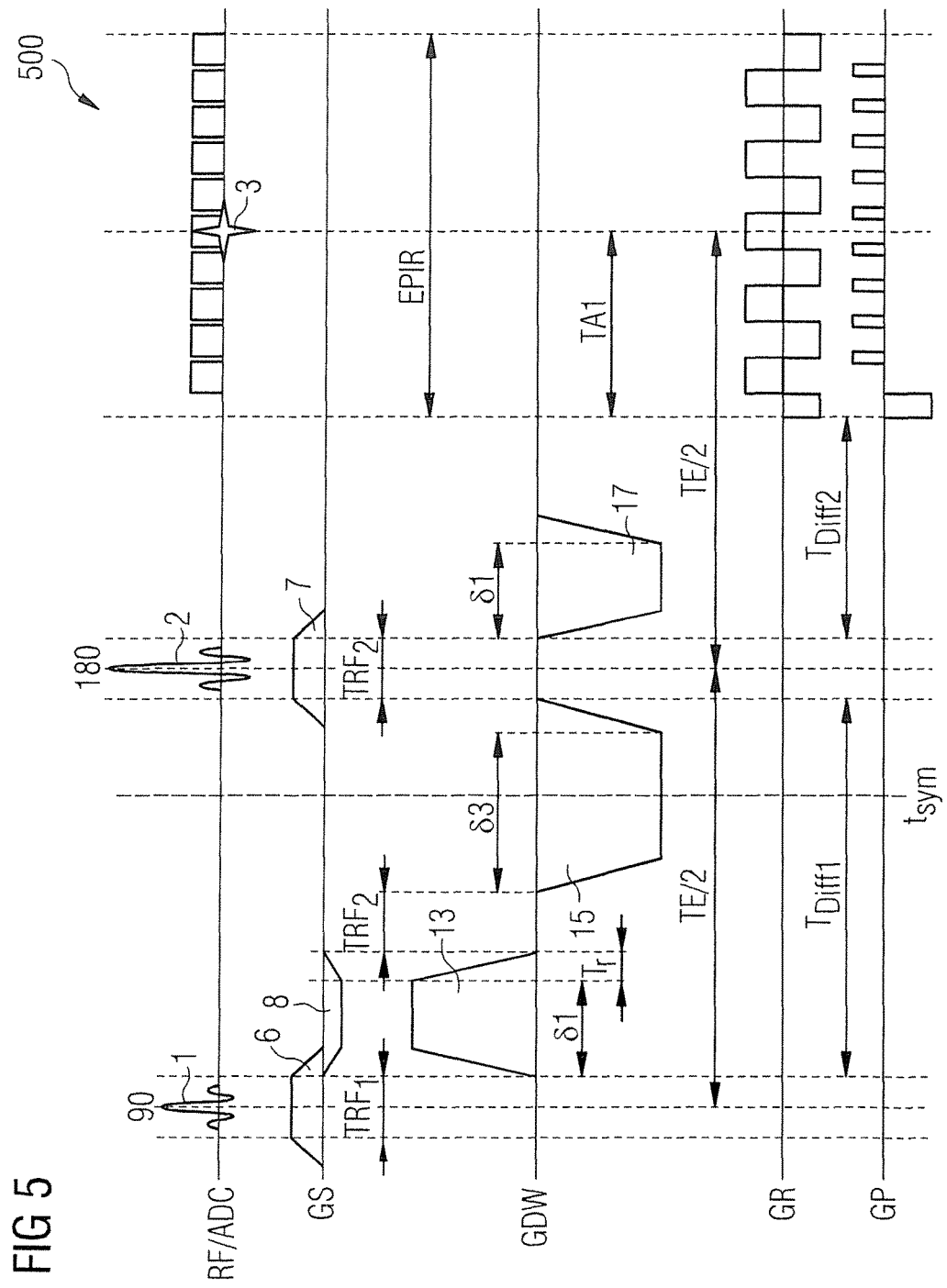
FIG. 5 is a sequence diagram in which a diffusion contrast pulse sequence is illustrated according to a second exemplary embodiment of the invention.

If it is assumed that $T_{Diff1} \geq 3T_{Diff2} + T_{RF2} - T_r$, which corresponds to the pulse sequence shown in FIG. 5, in this case, $\delta_2 = 0$ and $\delta_1 = T_{Diff2} - T_r$ produces the maximum diffusion weighting. Therefore, the second 14 and fourth gradient 16 disappear and, according to formula (16), the third gradient 15 is twice as long as the first gradient 13 or the fifth gradient 17, i.e. $\delta_3 = 2\delta_1$. By insertion in formula (18), $\delta_1 = T_{Diff2}$ produces $$b_{vc5}(2) = 4\pi^2\gamma^2 G^2[(4/3)\delta_1^3 + 2\delta_1^2 T_{RF2}] = 4\pi^2\gamma^2 G^2[(4/3)T_{Diff2}^3 + 2T_{Diff2}^2 T_{RF2}] \tag{20}$$

If the second term is ignored, i.e. the diffusion-sensitization during the first pause and during the switching of the RF refocusing pulse 2, the following is obtained:

$$b_{vc5}(2) > (16/3)\pi^2\gamma^2 G^2 T_{Diff2}^3 = 8(2/3)\pi^2\gamma^2 G^2 T_{Diff2}^3 = 8b_{vc}. \tag{21}$$

In this borderline case, therefore, the diffusion-sensitization of the sequence according to the invention is higher by more than a factor of 8 than the diffusion-sensitization when using the conventional velocity-compensated sequence shown in FIG. 2. The time required to achieve a desired diffusion sensitivity $b_0$ for the diffusion sensitization $T_{Diff2,fc5}$ is correspondingly reduced by a factor of 2:

$$T_{Diff2,fc5} = \sqrt[3]{\frac{1}{8}} \, T_{Diff2,fc} = \frac{1}{2} T_{Diff2,fc}. \tag{22}$$

The echo time relevant for the T2 decay can therefore be halved compared to the pulse sequence shown in FIG. 2.

In order to obtain a comparison with the Stejskal-Tanner sequence, here the time $\Delta$ is also inserted between the first gradient 13 and the fifth gradient 17. In the borderline case considered:

$$\Delta = 3\delta_1 + 2T_{RF2} = 3T_{Diff2} + 2T_{RF2}. \tag{23}$$

The resolution of equation (23) after $T_{RF2}$ and insertion into equation (20) produces the following:

$$b_{vc5}(2) = 4\pi^2\gamma^2 G^2[(4/3)T_{Diff2}^3 + 2T_{Diff2}^2 T_{RF2}] = 4\pi^2\gamma^2 G^2 T_{Diff2}^2[\Delta - (5/3)T_{Diff2}] < 4\pi^2\gamma^2 G^2 T_{Diff}^2(\Delta - T_{Diff2}/3) = b_{Stejskal}. \tag{24}$$

Therefore, with the velocity-compensated sequence according to the invention, the diffusion-sensitization is genuinely lower than that of the non-velocity-compensated Stejskal-Tanner sequence, wherein, however, the pulse sequence according to the invention is completely velocity-compensated.

The following is concerned with the optimum design of the pulse sequence according to the invention. It is assumed that the time $T_{Diff1}$ available before the RF refocusing pulse 2 and the time $T_{Diff2}$ available after the RF refocusing pulse 2 for the diffusion sensitization are predefined. Moreover, a maximum gradient amplitude $G_{max}$ and a maximum gradient slew rate $S_{max}$ are predefined. The object is to define the duration of the five gradient pulses such that a maximum diffusion sensitization (i.e. a maximum b-value) is achieved in the given time. Here, it is also possible for the times $T_{Diff1}$ and $T_{Diff2}$ also to be implicitly predefined via a desired echo time TE, the duration of the RF pulses $TRF_1$ and $TRF_2$ and the time interval $TA_1$ from the start of the readout line EPIR until the echo time TE and the duration of further modules which are to be switched.

First, the shortest ramp time $T_r$ in which it is possible to ramp a gradient up to the maximum gradient amplitude $G_{max}$ taking into account the predefined maximum gradient slew time $S_{max}$ is calculated. This time is selected as the common ramp time of all gradients. Next, the duration of the five gradients is established. Here, the optimum duration of the gradients depends upon the relative length of the time intervals $T_{Diff1}$ and $T_{Diff2}$:

If the time $T_{Diff1}$ available before the RF refocusing pulse 2 for the diffusion sensitization and the time $T_{Diff2}$ available after the RF refocusing pulse for the diffusion sensitization are equally long, this achieves the aforementioned borderline case with which the pulse sequence according to the invention changes to the conventional pulse sequence shown in FIG. 2.

When the times $T_{Diff1}$, $T_{Diff2}$, $T_{RF2}$ and $T_r$ are selected such that $T_{Diff1} \geq 3T_{Diff2}+T_{RF2}-T_r$, as already mentioned. This achieves a pulse sequence according to a second exemplary embodiment of the invention with the structure shown in FIG. 5.

In this borderline case, with which the time $T_{Diff1}$ available before the RF refocusing pulse for the diffusion sensitization is very much longer than the time $T_{Diff2}$ available after the RF refocusing pulse for the diffusion sensitization, maximum diffusion sensitization is obtained with the following gradient durations:

$$\delta_1 = \delta_5 = T_{Diff2} - T_r$$

$$\delta_2 = \delta_4 = 0$$

$$\delta_3 = 2\delta_1 = 2(T_{Diff2} - T_r)$$

$$\Delta T_{23} = T_{RF2}. \quad (25)$$

With this choice, the sequence with five gradients 13, 14, 15, 16, 17 in FIG. 4 is reduced to the sequence 500 shown in FIG. 5 with three gradients 13, 15, 17, since the second gradient 14 and the fourth gradient 16 have the duration zero. Unlike the case with the pulse sequence in FIG. 4, in the borderline case $(T_{Diff1} \geq 3T_{Diff2}+T_{RF2}-T_r)$ considered here, all the time $T_{Diff1}$ available after the RF refocusing pulse is utilized for the diffusion sensitization. From the time $T_{Diff1}$ available before the RF refocusing, a time interval $$T_{Diff1,eff} = \delta_1 + \delta_3 + 2T_r + T_{RF2} = 3(T_{Diff2} - T_r) + 2T_r + T_{RF2} = 3T_{Diff2} - T_r + T_{RF2} \leq T_{Diff1} \quad (26)$$

is utilized for the diffusion sensitization.

If, on the other hand, $T_{Diff1} < T_{Diff1} < 3T_{Diff2}+T_{RF2}-T_r$ is used, this achieves the practically far most important case corresponding to the first exemplary embodiment, which is shown in FIG. 4. For optimum diffusion sensitization with this embodiment, the following conditions should be met:

$$\delta_3 = 2(\delta_1 - \delta_2)(\text{formula (17)}) \rightarrow \quad \text{i)}$$

$$2\delta_1 - 2\delta_2 - \delta_3 = 0 \quad \text{i')}$$

$$\delta_1 + \delta_2 + \delta_3 + 3T_r + T_{RF2} = T_{Diff1} \text{ (complete utilization of the time } T_{Diff1}) \quad \text{ii)}$$

$$\delta_1 + \delta_2 2T_r = T_{Diff2} \text{ (complete utilization of the time } T_{Diff2}). \quad \text{iii) (27)}$$

The solution of the equation system with three unknowns produces:

$$\delta_1 = \delta_5 = (T_{Diff1} + T_{Diff2} - 5T_r - T_{RF2})/4$$

$$\delta_2 = \delta_4 = (3T_{Diff2} - T_{Diff1} + 3T_r + T_{RF2})/4$$

$$\delta_3 = (T_{Diff1} - T_{Diff1}) - 4T_r - T_{RF2}$$

$$\Delta T_{23} = T_{RF2}. \quad (28)$$

Therefore, in the optimum borderline case with the parameters according to equation (28), the duration of the individual diffusion contrast gradient pulses 13, 14, 15, 16, 17 is selected such that all the available time $T_{Diff1} + T_{Diff2}$ available for the diffusion sensitization is utilized.

Figure 6:
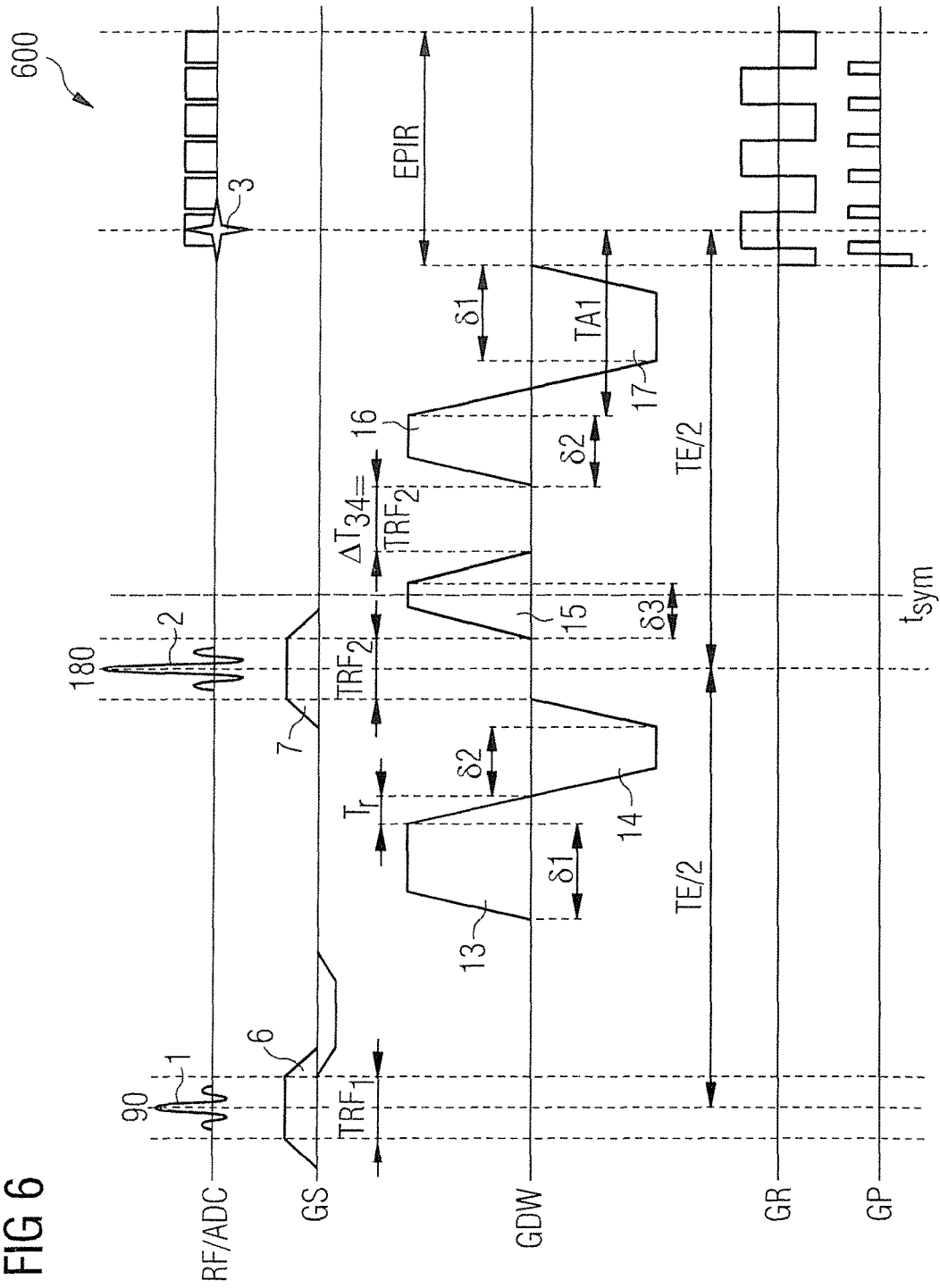
FIG. 6 is a sequence diagram in which a diffusion contrast pulse sequence is illustrated according to a third exemplary embodiment of the invention.

FIG. 6 shows a graph illustrating a pulse sequence 600 according to a third exemplary embodiment of the invention. In this exemplary embodiment $T_{Diff2} > T_{Diff1}$ is set.

If more time is available for the diffusion sensitization after the RF refocusing pulse 2 than before the RF refocusing pulse, all the diffusion contrast gradients 13, 14, 15, 16, 17 on the time axis are shifted such that the RF refocusing pulse 2 falls into the gap between the second gradients 14 and the third gradients 15. Now a new equally long gap is formed between the third gradient 15 and the fourth gradient 16 during which no gradients are switched. The relative positive or negative sign before the third gradient 15 with respect to the first and second gradients 13, 14 has to be reversed since this is now switched after the RF refocusing pulse 2. Here, the case $T_{Diff1} > T_{Diff2}$ could be of practical relevance when a very long RF excitation pulse 1 is used, for example for a two- or three-dimensional localized excitation (Siemens product name ZOOMIt) or an additional echo train is acquired, for example for coil calibration, immediately after the RF excitation pulse 1 (see DE 102009014461/U.S. Pat. No. 8,570,034 B2 and DE 102009014498/U.S. Pat. No. 8,461,840 B2).

In the borderline-case considerations, it was assumed that the times $T_{Diff1}$ and $T_{Diff2}$ available for the diffusion sensitization, e.g. are for example predefined implicitly from a desired echo time TE, the duration of the RF pulses 1, 2 $TRF_1$ and $TRF_2$ and the time interval $TA_1$ and the duration of the gradient pulses 13, 14, 15, 16, 17 is sought with which maximum diffusion-sensitization is achieved in the given time. Of more practical relevance is the case when a desired diffusion sensitization is predefined (as the b-value) and the shortest possible echo time TE is sought with which this b-value can be implemented. However, this problem can be attributed to the problem already solved in that an echo time is predefined, the times $T_{Diff1}$ and $T_{Diff2}$ for this calculated and the maximum diffusion sensitization determined therefrom with formulas (22)-(24) and (17). If this b-value is too small, the predefined echo time TE is increased gradually until the desired b-value can be implemented. If, however, the b-value first calculated is greater than the predefined b-value, the predefined echo time TE is decremented appropriately. Obviously, instead of the exhaustive search, it is also, for example, possible to search effectively for the optimum echo time with a fast bisection method.

Figure 7:
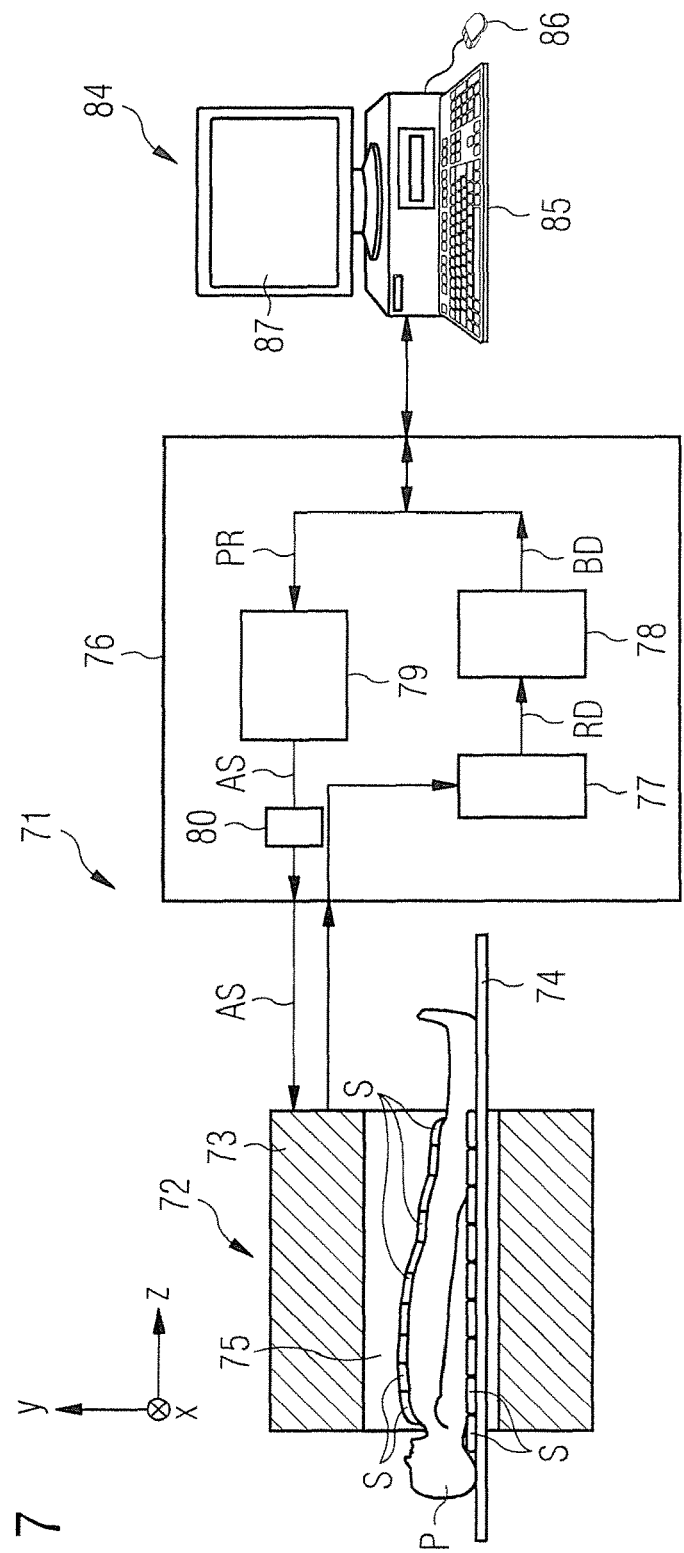
FIG. 7 schematically illustrates a magnetic resonance imaging system according to an exemplary embodiment of the invention.

FIG. 7 shows an exemplary embodiment of a magnetic resonance system 71 according to the invention, which is designed to operate so as to implement the method according to the invention. The core of this magnetic resonance system 71 is the actual magnetic resonance tomography scanner 72 in which a patient P is positioned on a patient support table 74 (also called a patient bed) in an annular basic field magnet 73 surrounding the measuring chamber 75. Located on and, possibly also under, the patient, there is, for example, a number of local coils S, also called magnetic resonance coils.

The support table 74 can be displaced in the longitudinal direction, i.e. along the longitudinal axis of the tomography scanner 72. In the spatial coordinate system also shown, this direction is designated the z-direction. Inside the basic field magnet, the tomography scanner 72 has a whole-body coil (not shown) with which radio-frequency pulses can be emitted and received. The tomography scanner 72 also has gradient coils in the conventional way, not shown in the figure, in order to enable a magnetic field gradient to be applied in each of the spatial directions x, y, z.

The tomography scanner 72 is operated by a control computer 76, which is here shown separately. A terminal 84 is connected to the control computer 76. This terminal 84 has a screen 87, a keyboard 85 and a display device 86 for a graphical user interface, for example a mouse 86 or the like. The terminal 84 is used inter alia as a user interface via which an operator operates the control computer 76 and hence the tomography scanner 72. Both the control computer 76 and the terminal 84 can also be integral components of the tomography scanner 72.

In addition, the magnetic resonance system 71 can have all further conventional components or features of systems of this kind, such as interfaces for the connection of a communication network, for example an image information system or the like. However, none of these components are shown in FIG. 7 for clarity.

An operator can use the terminal 84 to communicate with the control computer 76 and hence ensure that the desired measurements are performed in that, for example, the tomography scanner 72 is actuated by the control computer 76 such that the required radio-frequency pulse sequences are emitted by the radio-frequency coils and the gradient coils are switched in a suitable way. The control computer 76 is also used to acquire the raw data RD sent from the tomography scanner 72 required for the imaging. To this end, the control computer 76 has a raw data acquisition processor 77 in which the measured signals sent from the tomography scanner 72 are converted into raw data RD. For example, this is achieved by demodulation and subsequent digitization of the measuring signals. In a signal evaluating processor 78, which can, for example, be a module of the control computer 76, raw data RD are reconstructed into image data BD. The image data BD can be visualized on the screen 87 of the terminal 84 and/or stored in a memory or sent via a network. To execute the method according to the invention, the control computer 76 has an actuation sequence determination processor 79, with which an actuation sequence AS is determined that, for example, includes the pulse sequence 400. For example, the actuation sequence determination processor 79 receives protocol data PR from the terminal 84, which represent predefined parameter values of a pulse sequence 400 to be determined. Furthermore, the control computer 76 includes an actuation sequence generating processor 80, which is configured to play out an actuation sequence AS including the pulse sequence 400 according to the invention to the magnetic resonance tomography scanner 72 so that the method 300 according to the invention for actuating a magnetic resonance imaging system for generating magnetic resonance image data BD of an object under examination P is executed.

The components required for the implementation of the invention in a magnetic resonance system 71 such as the raw data acquisition processor 77, the signal evaluating processor 78, the actuation sequence determination processor 79 or the actuation sequence generating processor 80 can be implemented at least partially or even completely in the form of software components. Conventional magnetic resonance systems already include programmable control devices, so that in this way, the invention can preferably be implemented with the use of suitable control software. I.e., a corresponding computer-readable medium can be loaded directly into the memory of a programmable control computer 76 of the relevant magnetic resonance system 71, having program code in order to carry out the method 300 according to the invention. This means that existing magnetic resonance systems can be retrofitted in a simple and inexpensive way.

Some of the components also can be implemented as sub-routines in components already provided in the control computer 76 or for components provided also to be used for the object of the invention. This relates, for example, to the actuation sequence determination processor 79, which can, for example, be implemented in an existing control computer 76, which is intended to actuate the radio-frequency coils, gradient coils or other components in the tomography in a suitable way for carrying out a conventional imaging measurement.

According to the invention, use is made of the observation that in diffusion imaging based on the spin echo technique, frequently more time is available for diffusion preparation before the RF refocusing pulse 2 than after the RF refocusing pulse.

With the conventional, non-flow-compensated Stejskal-Tanner sequence (see FIG. 1), this time can be used for the diffusion sensitization, if the two diffusion gradients are not arranged symmetrically around the RF refocusing pulse, but the first gradient pulse 4 is switched chronologically as early as possible, if the magnetization is dephased after the end of the first gradient pulse 4 and hence the time interval between the end of the first diffusion gradient 4 and the start of the second diffusion gradient 5, during which no gradients are applied, contributes to the b-value.

Moreover, with conventional flow-compensated sequences (see FIG. 2), an asymmetrical arrangement of the two gradient pairs 9, 10, 11, 12 does not increase the b-value, since the magnetization is completely rephased after the end of the first pair 9, 10.

With the sequence according to the invention 400, three or five gradient pulses are employed to utilize the longer time interval before the RF refocusing pulse for the diffusion sensitization.

The above-described method, pulse sequences and apparatuses are only preferred exemplary embodiments of the invention and that the invention can be varied by the person skilled in the art as long as this is disclosed in the claims. For completeness, it is noted that the use of the indefinite article "a" or "an" does not preclude the possibility that the features in question may also be present on a multiple basis. Similarly, the term "unit" does not preclude the possibility that the unit comprises a plurality of components, which could also be spatially distributed.

Although modifications and changes may be suggested by those skilled in the art, it is the intention of the inventor to

I claim as my invention:

1. A method for operating a magnetic resonance (MR) data acquisition scanner of a magnetic resonance imaging apparatus comprising:

while an examination subject is situated in the MR data acquisition scanner, exciting nuclear spins in the subject by radiating a radio-frequency (RF) excitation pulse in the MR data acquisition scanner, and thereby causing said nuclear spins to emit RF signals;

in a readout procedure that follows radiation of said RF excitation pulse, detecting said RF signals and subsequently converting the detected RF signals into MR raw data;

between radiation of said RF excitation pulse and said readout procedure, effecting diffusion sensitization of said nuclear spins by operating said MR data acquisition scanner with a diffusion contrast gradient pulse sequence that comprises an uneven number of 2n+1 diffusion contrast gradient pulses that are activated in chronological succession, with a sum of the zeroth gradient moments of the 2n+1 diffusion contrast gradient pulses having a value of zero and a sum of first gradient moments of said diffusion contrast gradient pulses having a value of zero, and radiating a single RF refocusing pulse between two of said diffusion contrast gradient pulses; and in a computer, reconstructing image data of the examination subject from said raw MR data, and making the image data available from the computer in electronic form as a data file.

2. A method as claimed in claim 1 comprising activating said diffusion contrast gradient pulse sequence with first to n-th diffusion contrast gradient pulses, and n+2-th to 2n+1-th diffusion contrast gradient pulses of said diffusion contrast gradient pulse sequence being activated in point-symmetric pairs with respect to a temporal midpoint of said diffusion contrast gradient pulse sequence, and with an n+1-th diffusion contrast gradient pulse being activated axially symmetrically with respect to an axis proceeding through said temporal midpoint and having a zeroth gradient moment that is twice a magnitude of a sum of zeroth gradient moments of the first to the n-th diffusion contrast gradient pulses.

3. A method as claimed in claim 1 comprising operating said MR data acquisition scanner to radiate said single RF refocusing pulse and to activate said diffusion contrast gradient pulse sequence with said temporal midpoint of said diffusion contrast gradient pulse sequence being chronologically before radiation of said single RF refocusing pulse.

4. A method as claimed in claim 1 comprising activating said diffusion contrast gradient pulse sequence with a sum of the zeroth gradient moments of two directly sequential diffusion contrast gradient pulses having a value other than zero.

5. A method as claimed in claim 1 comprising operating said MR data acquisition scanner to activate said diffusion contrast gradient pulse sequence and to radiate said RF refocusing pulse with said single RF refocusing pulse being radiated between an n+1-th diffusion contrast gradient pulse and an n+2-th diffusion contrast gradient pulse in said diffusion contrast gradient pulse sequence, and with said n+1-th diffusion contrast gradient pulse having a same mathematical sign as an n-th diffusion contrast gradient pulse of said diffusion contrast gradient pulse sequence.

6. A method as claimed in claim 1 comprising operating said MR data acquisition scanner to activate said diffusion contrast gradient pulse sequence and to radiate said RF refocusing pulse with said single RF refocusing pulse being radiated between an n-th diffusion contrast gradient pulse and an n+1-th diffusion contrast gradient pulse in said diffusion contrast gradient pulse sequence, and with said n+1-th diffusion contrast gradient pulse having an opposite mathematical sign as an n-th diffusion contrast gradient pulse of said diffusion contrast gradient pulse sequence.

7. A method as claimed in claim 1 comprising activating said diffusion contrast gradient sequence with all diffusion contrast gradient pulses therein having equal amplitudes and respective durations that use all available time for diffusion sensitization of said nuclear spins.

8. A method as claimed in claim 1 comprising detecting an echo-planar imaging (EPI) echo train in said readout procedure.

9. A method as claimed in claim 1 wherein n=2.

10. A method as claimed in claim 1 wherein said diffusion contrast gradient pulse sequence comprises a first diffusion contrast gradient pulse and a second diffusion contrast gradient pulse, each having a mathematical sign, and wherein the respective mathematical signs of said first and second diffusion contrast gradient pulses are different.

11. A method as claimed in claim 1 wherein said diffusion contrast gradient pulse sequence comprises a second diffusion contrast gradient pulse and a fourth diffusion contrast gradient pulse, and wherein a temporal duration of said second diffusion contrast gradient pulse and said fourth diffusion contrast gradient pulse is zero.

12. A method as claimed in claim 1 comprising operating said MR data acquisition scanner to activate at least one slice selection gradient in a slice selection direction synchronized with radiation of said RF excitation pulse.

13. A method as claimed in claim 1 comprising operating said MR data acquisition scanner during said diffusion sensitization of said nuclear spins to activate a slice selection gradient synchronized with radiation of said single RF refocusing pulse.

14. A system for determining an operating sequence for a magnetic resonance (MR) data acquisition scanner of an MR imaging apparatus comprising:

a computer;

a user interface allowing entry of parameters for an operating sequence for said MR scanner;

said computer being configured to automatically generate said operating sequence dependent on said parameters to include radiation of a radio-frequency (RF) excitation pulse in the MR data acquisition scanner that causes nuclear spins in a subject to emit RF signals, and a readout procedure that follows radiation of said RF excitation pulse, wherein said RF signals are detected, and wherein, between radiation of said RF excitation pulse and said readout procedure, a diffusion contrast gradient pulse sequence is activated that comprises an uneven number of 2n+1 diffusion contrast gradient pulses that are activated in chronological succession, with a sum of the zeroth gradient moments of the 2n+1 diffusion contrast gradient pulses having a value of zero and a sum of first gradient moments of said diffusion contrast gradient pulses having a value of zero, and radiating a single RF refocusing pulse between two of said diffusion contrast gradient pulses; and said computer being configured to emit said operating sequence in an electronic form for operating said MR data acquisition scanner.

15. A magnetic resonance (MR) imaging apparatus comprising:
- an MR data acquisition scanner;
- a control computer configured to operate the MR data acquisition scanner while an examination subject is situated in the MR data acquisition scanner, to excite nuclear spins in the subject by radiating a radio-frequency (RF) excitation pulse in the MR data acquisition scanner and thereby causing the nuclear spins to emit RF signals;
- said computer being configured to operate the MR data acquisition scanner in a readout procedure that follows radiation of said RF excitation pulse, to detect said RF signals and to subsequently convert the detected RF signals into MR raw data;
- said computer being configured to operate said MR data acquisition scanner, between radiation of said RF excitation pulse and said readout procedure, with a diffusion contrast gradient pulse sequence that comprises an uneven number of 2n+1 diffusion contrast gradient pulses that are activated in chronological succession, with a sum of the zeroth gradient moments of the 2n+1 diffusion contrast gradient pulses having a value of zero and a sum of first gradient moments of said diffusion contrast gradient pulses having a value of zero, and radiating a single RF refocusing pulse between two of said diffusion contrast gradient pulses; and
- a reconstruction computer configured to reconstruct image data of the examination subject from said raw MR data, and to make the image data available from the computer in electronic form as a data file.

16. A non-transitory, computer-readable data storage medium encoded with programming instructions, said data storage medium being loaded into a computer of a magnetic resonance (MR) imaging apparatus that comprises an MR data acquisition scanner, said programming instructions causing said computer to:
- while an examination subject is situated in the MR data acquisition scanner, excite nuclear spins in the subject by operating the MR data acquisition scanner to radiate a radio-frequency (RF) excitation pulse in the MR data acquisition scanner;
- in a readout procedure that follows radiation of said RF excitation pulse, operate the MR data acquisition scanner to detect said RF signals and to subsequently convert the detected RF signals into MR raw data;
- between radiation of said RF excitation pulse and said readout procedure, operate said MR data acquisition scanner with a diffusion contrast gradient pulse sequence that comprises an uneven number of 2n+1 diffusion contrast gradient pulses that are activated in chronological succession, with a sum of the zeroth gradient moments of the 2n+1 diffusion contrast gradient pulses having a value of zero and a sum of first gradient moments of said diffusion contrast gradient pulses having a value of zero, and to radiate a single RF refocusing pulse between two of said diffusion contrast gradient pulses; and
- reconstruct image data of the examination subject from said raw MR data, and make the image data available from the computer in electronic form as a data file.

* * * * *